United States Patent
Hirst

(10) Patent No.: US 11,614,758 B2
(45) Date of Patent: Mar. 28, 2023

(54) INTEGRAL HALF CYCLE (IHC) CONTROL

(71) Applicant: Hewlett-Packard Development Company, L.P., Spring, TX (US)

(72) Inventor: Mark Hirst, Boise, ID (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/944,444

(22) Filed: Jul. 31, 2020

(65) Prior Publication Data

US 2020/0363757 A1 Nov. 19, 2020

Related U.S. Application Data

(63) Continuation of application No. 16/481,368, filed as application No. PCT/US2017/025586 on Mar. 31, 2017, now Pat. No. 10,775,725.

(51) Int. Cl.
*G05F 1/455* (2006.01)
*G03G 15/00* (2006.01)
(Continued)

(52) U.S. Cl.
CPC .............. *G05F 1/455* (2013.01); *B41J 2/475* (2013.01); *G03G 15/80* (2013.01); *G05F 5/00* (2013.01);
(Continued)

(58) Field of Classification Search
CPC .. H05B 39/08; H05B 39/048; H05B 41/3924; H05B 45/305; H05B 45/31;
(Continued)

(56) References Cited

U.S. PATENT DOCUMENTS

| | | | |
|---|---|---|---|
| 5,495,275 A | 2/1996 | Martinengo | |
| 6,111,230 A * | 8/2000 | Cao | G03G 15/2003 323/236 |
| 6,375,318 B1 | 4/2002 | Johnson | |
| 6,519,427 B2 | 2/2003 | Kataoka | |
| 6,710,309 B1 * | 3/2004 | Hirst | G01K 3/10 219/492 |
| 6,853,818 B2 | 2/2005 | Nishida | |

(Continued)

FOREIGN PATENT DOCUMENTS

JP H07234728 A 9/1995
WO WO-2015141217 9/2015

OTHER PUBLICATIONS

Hasani, R., et al., "Design Optimal Controller For Reduce Voltage Flicker and Harmonic Distortion in Power System Base on SVC," IJEIT, Jul. 2013, pp. 540-544, vol. 3, Issue 1.

*Primary Examiner* — Walter L Lindsay, Jr.
*Assistant Examiner* — Jessica Eley
(74) *Attorney, Agent, or Firm* — Brooks, Cameron & Huebsch, PLLC

(57) ABSTRACT

Power to an electrical device is controlled using a phase control that changes a cutoff phase of an alternating current (AC) electrical signal delivered to the electrical device. The power delivered to the electrical device is increased to an operational level using the phase control. A level of the power delivered to the electrical device is maintained at the operational level using an integral half cycle control that selectively removes a plurality of half cycles from the AC electrical signal delivered to the electrical device such that a plurality of remaining half cycles in the AC electrical signal delivered to the electrical device have a frequency outside a range of sub-harmonic frequencies.

17 Claims, 10 Drawing Sheets

(51) Int. Cl.

| | | |
|---|---|---|
| *H05B 1/02* | (2006.01) | |
| *B41J 2/475* | (2006.01) | |
| *H03K 5/156* | (2006.01) | |
| *G05F 5/00* | (2006.01) | |
| *H02M 1/12* | (2006.01) | |
| *H02M 5/257* | (2006.01) | |
| *H02M 5/27* | (2006.01) | |
| *G03G 15/20* | (2006.01) | |

(52) U.S. Cl.
CPC ........... *H02M 1/12* (2013.01); *H02M 5/2573* (2013.01); *H02M 5/27* (2013.01); *H03K 5/156* (2013.01); *H05B 1/0227* (2013.01); *H05B 1/0241* (2013.01); *G03G 15/2039* (2013.01)

(58) Field of Classification Search
CPC .... H05B 1/0227; H05B 1/0241; Y02B 20/30; G03G 15/2039; G03G 15/80; B41J 2/475; G05F 1/455; G05F 5/00; H02M 1/12; H02M 5/2573; H02M 5/27; H03K 5/156
See application file for complete search history.

(56) References Cited

U.S. PATENT DOCUMENTS

| | | |
|---|---|---|
| 6,901,226 B2 | 5/2005 | Claassen |
| 7,224,918 B2 | 5/2007 | Bartley et al. |
| 8,213,822 B2 | 7/2012 | Cook et al. |
| 2010/0166447 A1* | 7/2010 | Cook ................. G03G 15/2039 323/212 |
| 2010/0310267 A1 | 12/2010 | Shimura |
| 2013/0266334 A1* | 10/2013 | Shimura ................ G03G 15/80 399/69 |
| 2013/0322908 A1 | 12/2013 | Ogura |
| 2014/0341599 A1* | 11/2014 | Itoh .................... G03G 15/2039 399/69 |
| 2015/0093134 A1 | 4/2015 | Itoh |
| 2015/0110513 A1 | 4/2015 | Nagasaki |
| 2015/0331368 A1 | 11/2015 | Asano |
| 2016/0044745 A1 | 2/2016 | Nakayama |
| 2016/0185136 A1 | 6/2016 | Ng et al. |
| 2018/0115161 A1* | 4/2018 | Marsh-Croft ........... H02J 3/002 |

* cited by examiner

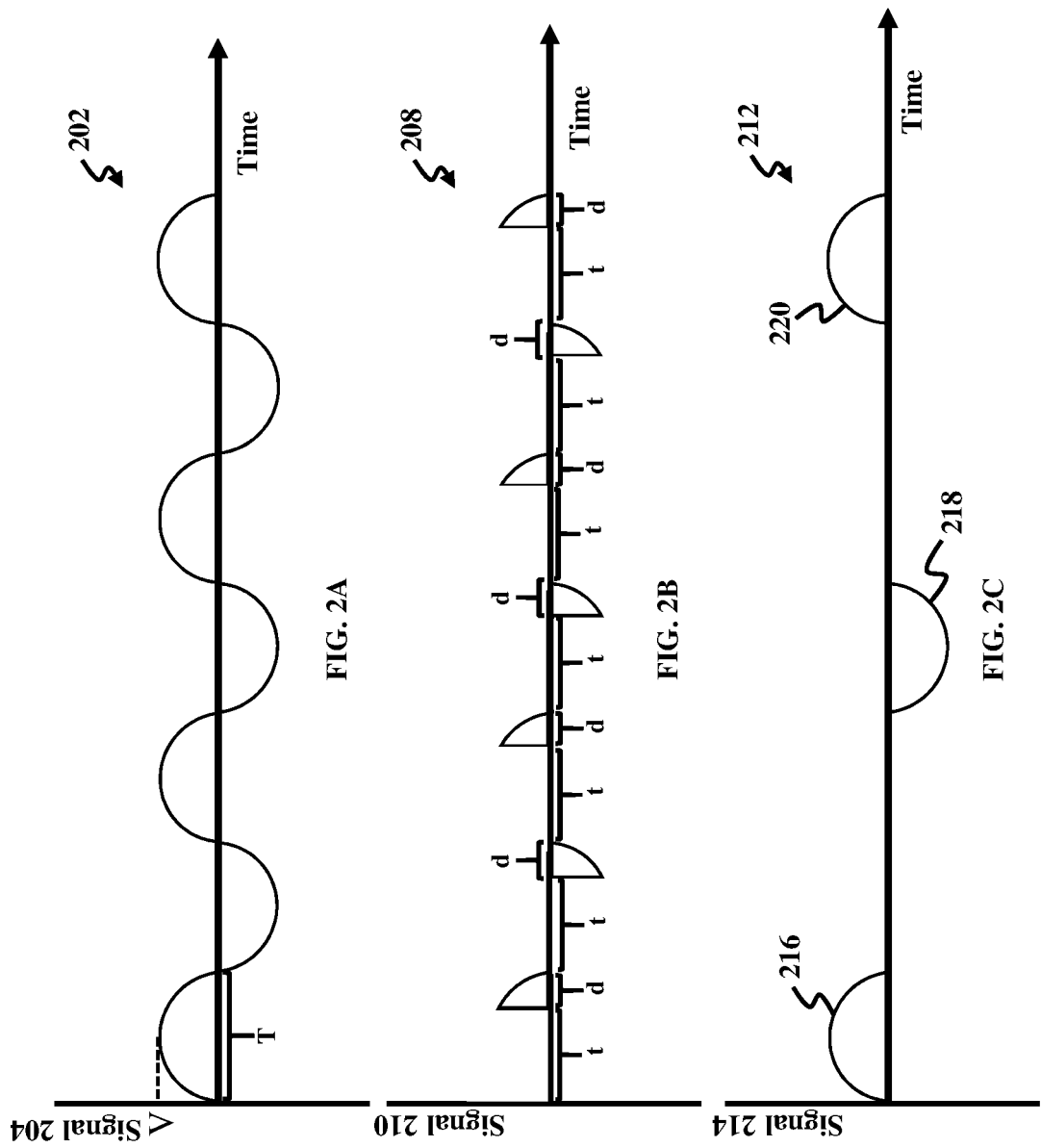

INTEGRAL HALF CYCLE (IHC) CONTROL

BACKGROUND

Heating elements may have application in electrical devices such as printers, copiers, or fax machines. In electrophotographic printers, for example, heat may be used to fuse toner to a printable media such as paper. Heating elements and devices typically use an alternating current (AC) electrical signal as the energy source, and may use resistive elements to convert electrical energy to heat. AC signals, however, may generate undesirable flicker and AC harmonics. In various regions across the world there are regulations that restrict the amount of flicker and AC harmonics that may be caused by personal and commercial equipment.

BRIEF DESCRIPTION OF THE DRAWINGS

FIG. 2A illustrates a diagram of an AC electrical signal applied to an electrical device, according to an example herein;

FIG. 2B illustrates a diagram of an electrical signal delivered to an electrical device using phase control, according to an example herein;

FIG. 2C illustrates a diagram of an electrical signal delivered to an electrical device using integral half cycle, according to an example herein;

DETAILED DESCRIPTION

Figure 1A:
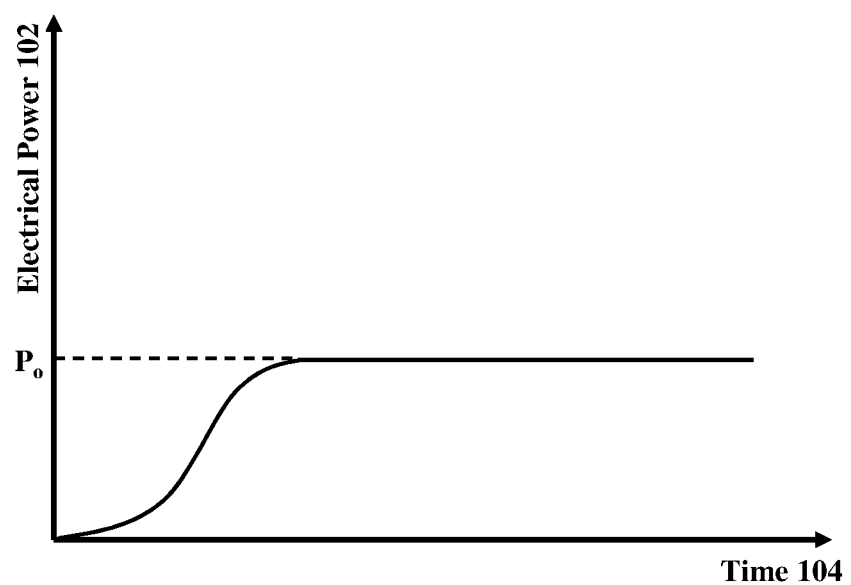
FIG. 1A illustrates a diagram of electrical power delivered to an electrical device, according to an example herein.

Electrical devices may require power control. Power delivered to the electrical device typically has to increase gradually from zero to an operating level to avoid sub-harmonics or flicker in the power grid. FIG. 1A is an example illustrating increasing electrical power 102 delivered to an electrical device with respect to time 104. The power is increased until it reaches an operating level $P_o$. After this point, it may be required to keep the power delivered to the device at the $P_o$ level. For example, if the electrical device is a heater, the level of electrical power delivered to the heater determines the amount of heat generated by the heater.

Figure 1B:
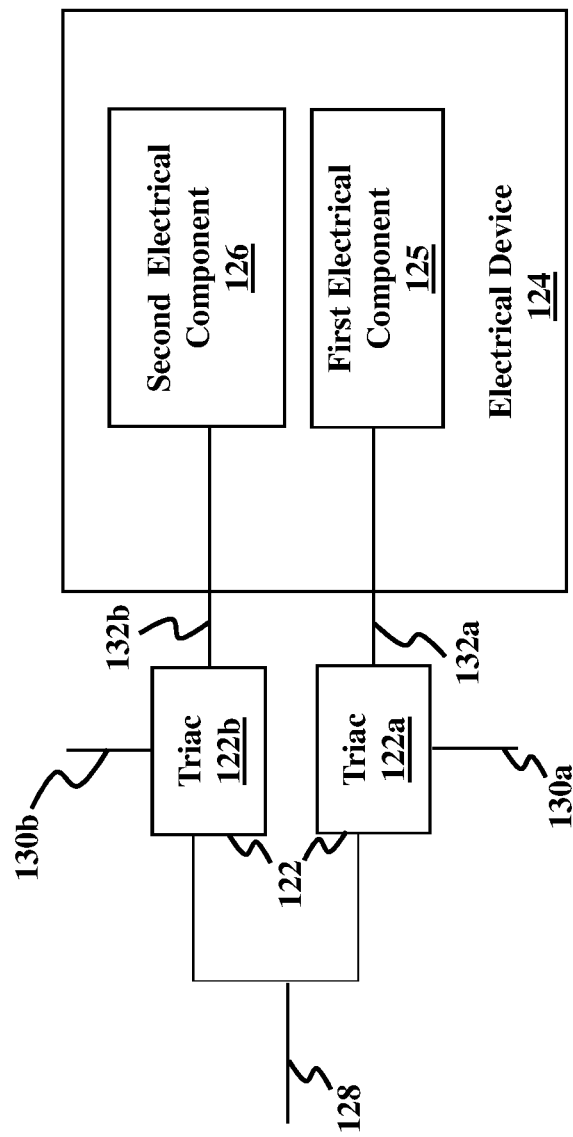
FIG. 1B is a schematic diagram of a system illustrating components of an electrical device.

FIG. 1B is a schematic diagram illustrating an example of a system 120 for controlling electrical power delivered to an electrical device 124. The system 120 may receive an electrical AC signal at an input 128. One or more semiconducting switches for alternating current devices 122 are operatively connected to the input 128. For example, the devices 122 may be individually configured as a triac 122a and a triac 122b, and each may control the power delivered to each of the components of the electrical device 124 at ports 132a and 132b. In an example herein, the electrical device 124 may include a first electrical component 125 and a second electrical component 126. Triacs 122a and 122b may use trigger signals 130a and 130b to control the power delivered to the electrical components 125 and 126, respectively. In an example, the first and second electrical components 125 and 126 may be different heating elements in a heating device, or other individually distinguishable electrical circuits.

Figure 1C:
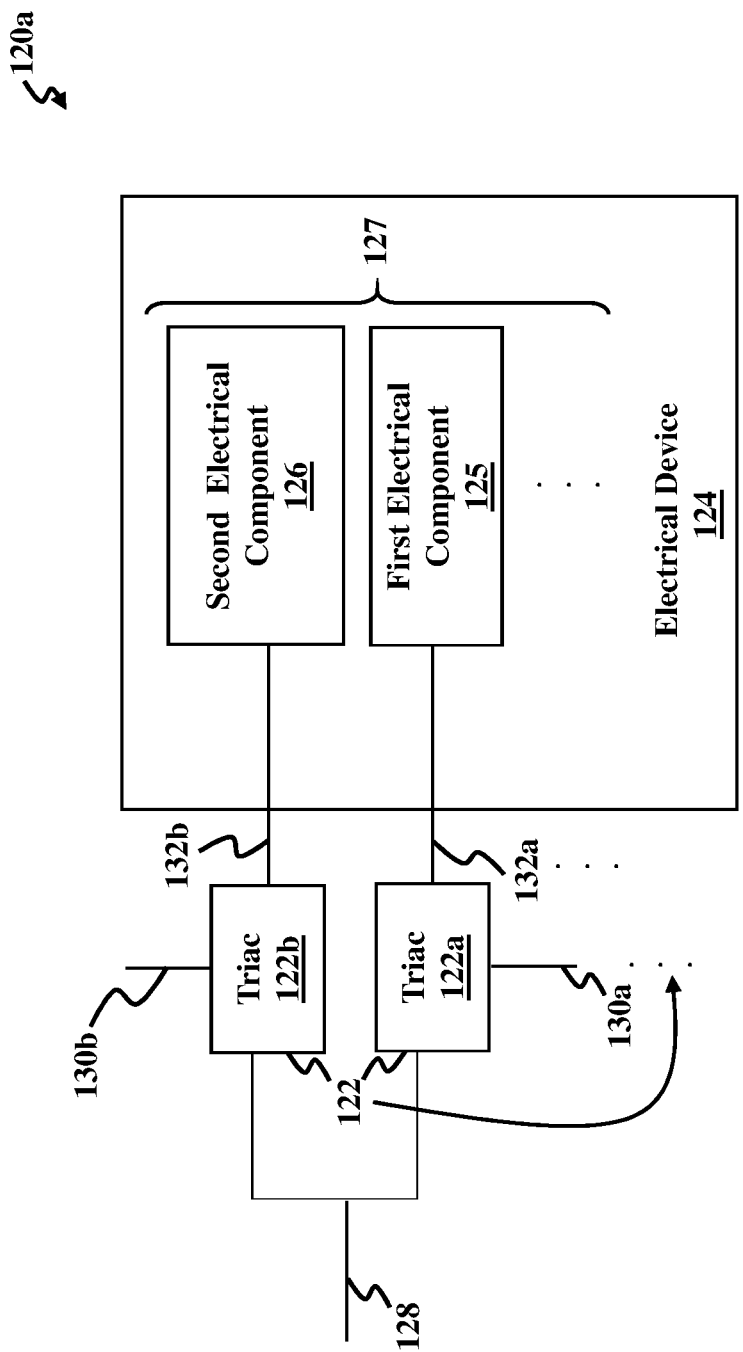
FIG. 1C is a schematic diagram of another system illustrating components of an electrical device.

In an example of another system 120a shown in FIG. 1C, the electrical device 124 may include more than two electrical components 127. In system 120a, a corresponding number of triacs 122 would each control the electrical power delivered to each of the electrical components 127, and a corresponding plurality of trigger signals and ports would also be provided.

FIGS. 2A to 2C, with reference to FIG. 1B, are diagrams illustrating controlling the power delivered to the electrical device 124 using the triac 122a or 122b. FIG. 2A illustrates a waveform 202 of an AC electrical signal 204 versus time that may be delivered to the triacs 122a or 122b on the port 132a or 132b, respectively. FIG. 2B illustrates a waveform 208 of a signal 210 versus time, using phase control (PC) for controlling the electrical power delivered to an electrical device 124. The signal 210 may be created by triggering the signal 204 at each half cycle at a trigger time t. For example, the trigger signal 130a of the triac 122a may trigger the signal at the trigger time t. After the trigger signal 130a is activated, the triac 122a acts as a conductor and passes the signal 204 through for the triac phase conduction time d, until the signal 204 crosses zero, when the triac 122a shuts down and functions as an open circuit. The power P delivered to the device 124 using PC for controlling the electrical power is given by:

$$P = \frac{1}{T} \times \frac{V^2}{R} \times \left(d \times \frac{T}{2} - \frac{1}{2} \times \sin(d \times T) \times \cos(d \times T)\right),$$

where V is the peak voltage, R is the load resistance of the device 124, and T=radians.

By increasing the trigger time t, from zero to the half cycle time T of the signal 202, the triac 122a may selectively allow or block a portion of half cycle (PC power control) or an integral half cycle of the signal 204 (IHC power control). Similar results may occur for triac 122b. FIG. 2C is an example illustrating a waveform 212 of a signal 214 versus time using an IHC power control approach, where half cycles 216, 218, and 220 are delivered to the electrical device 124.

The PC approach to power control, as illustrated in FIG. 2B, prevents sub-harmonics (or flicker) in the power grid because at least a portion of each of the half cycles of the signal 204 is delivered to the device 124. However, because the delivered signal 210 does not have the sinusoidal waveform, it contains harmonics. The integral half cycle control, as illustrated in FIG. 2C, does not generate harmonics in a power grid system, because the sinusoidal waveform 212 is preserved at each half cycle of the signal 204. However, because the frequency of the delivered half cycles by the signal 214 is less than the frequency of the signal 204, the integral half cycle approach causes sub-harmonics or flicker in a power grid system.

Figure 3:
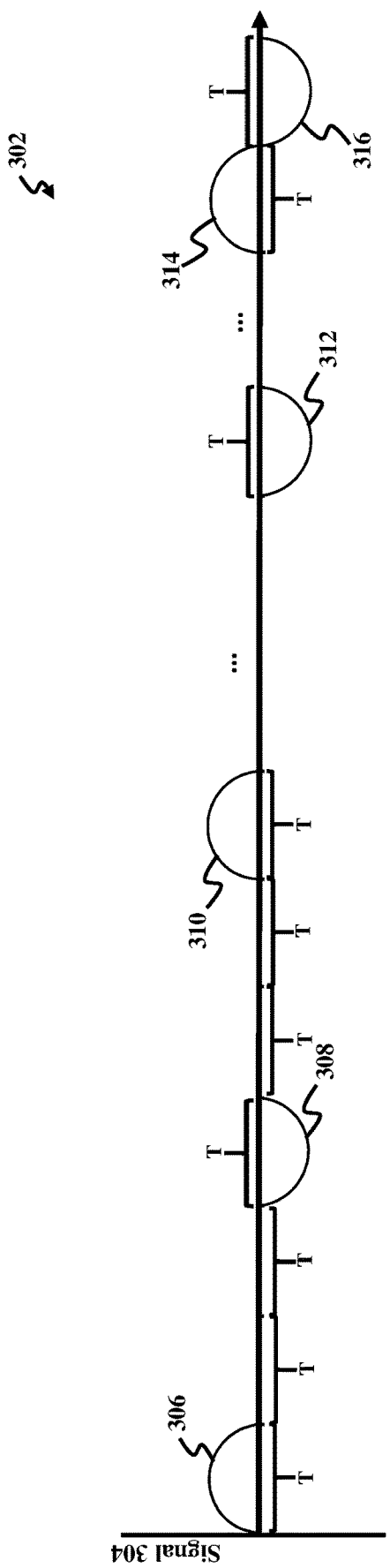
FIG. 3 illustrates a diagram of an electrical signal delivered to an electrical device using integral half cycle for controlling power and limiting flicker, according to an example herein.

FIG. 3 is a diagram illustrating an example of using an IHC approach to control electrical power delivered to the electrical device 124 of FIG. 1B. In an IHC approach, since positive or negative half cycles may be used individually, it may be required to balance the number of positive and negative half cycles. This prevents a direct current (DC) component to be drawn from the power grid. In this regard, a DC component can be damaging to the power grid because it may cause saturation of power transformers. FIG. 3 illustrates an example where the number of positive half cycles 306, 310, and 314 where the signal 304 has positive value, is equal to the number of negative half cycles 308, 312, and 316.

The most sensitive frequency range for sub-harmonics (or flicker) that is noticeable to the human eye is in the range of frequencies from 6-12 Hz. To move the sub-harmonics caused by the IHC power control outside this range, specific half cycles may be selected such that the frequency in which the specific half cycles are selected are outside the 6-12 Hz range. FIG. 3 illustrates an example of an IHC waveform 302 where the half cycles 306, 308, and 310 are selected within a 7T time period, where T is half of the time period of the original sinusoidal signal 204 of FIG. 2A. In an example where T is greater than approximately 72 milliseconds, the frequency at which the half cycles 306, 308, and 310 appear is less than 6 Hz. However, for a 50 Hz sinusoidal waveform, the half cycles 306, 108, and 310 need to appear in more than an approximately 50T time span for the resulting sub-harmonic frequency to be less than 6 Hz.

In the example of FIG. 3, if T is less than approximately 84 milliseconds, the frequency in which the half cycles 314 and 316 appear is more than 12 Hz, and therefore the resulting sub-harmonics or flicker is outside the range most sensitive to the human eye. Therefore, by varying the selection frequency of the half cycles, the IHC approach is modified such that the resulting sub-harmonics are outside the frequency range most sensitive to the human eye, and therefore flicker is highly mitigated.

Figure 4A:
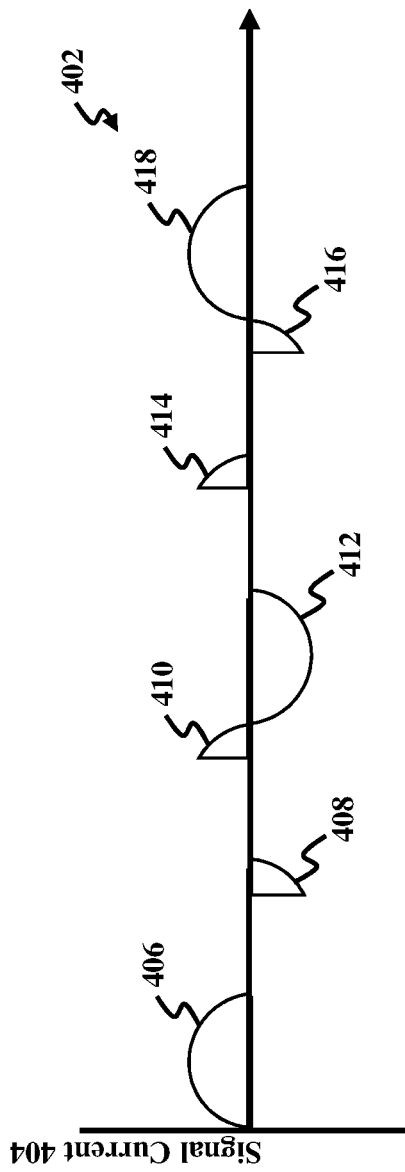
FIG. 4A illustrates a diagram of a resulting electrical signal delivered to an electrical component using a combination of integral half cycle and phase control, according to an example herein.
Figure 4B:
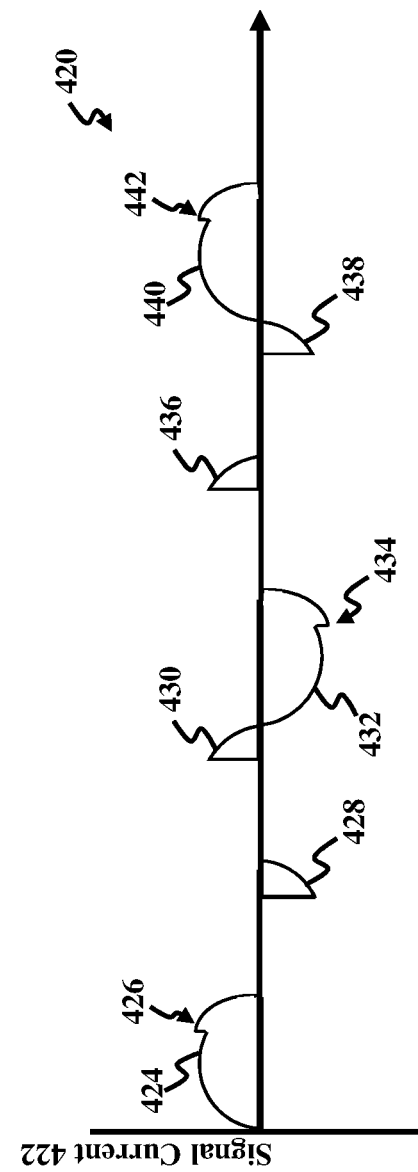
FIG. 4B illustrates a diagram of a resulting electrical signal delivered to an electrical device using a combination of integral half cycle and phase control, according to an example herein.

FIGS. 4A and 4B, with reference to FIG. 1B, are diagrams illustrating using the PC approach and the IHC approach simultaneously to control the electrical power delivered to the electrical device 124. FIG. 4A illustrates an example waveform 402 illustrating using the PC and IHC approaches simultaneously on a single component, for example, the first electrical component 125. In waveform 402, integral half cycles 406, 412, and 418 are delivered to the first electrical component 125. In other half cycles, PC is used to deliver signals 408, 410, and 414 to the first electrical component 125. Signal current 404 illustrates the total current drawn by the first electrical component 125, having an integral sinusoidal shape in any half cycle in which the IHC is used, and a partial sinusoidal shape in any half cycle in which PC power control is used.

FIG. 4B illustrates an example of intermixing IHC and PC by applying IHC power control to the first electrical component 125 and PC power control to the second electrical component 126. In the example illustrated in FIG. 4B, integral half cycles 424, 432, and 440 are delivered to the first electrical component 125, and phased control signals 426, 428, 430, 436, and 438 are delivered to the second electrical component 126. Because the total signal current 422 also includes both IHC and PC signals, the total harmonics and sub-harmonics; i.e., flicker, produced is limited. Therefore, intermixing IHC and PC simultaneously, by using either approach illustrated in FIGS. 4A and 4B, limits the amount of harmonics and flicker produced as a result of controlling the electrical power delivered to the electrical device 124.

Figure 5:
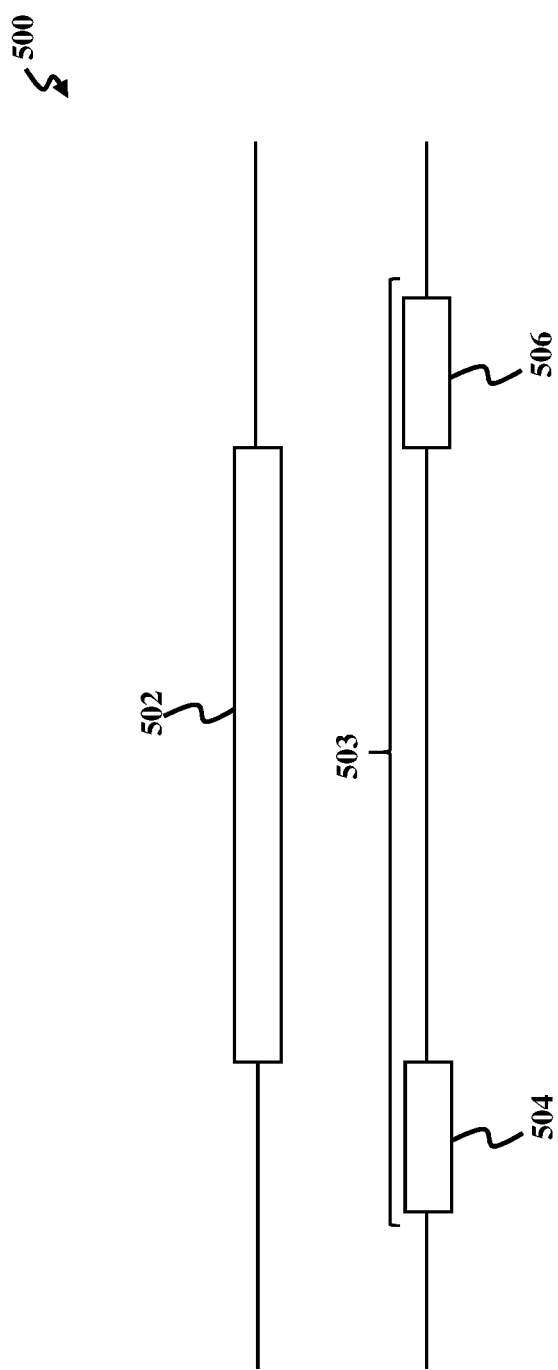
FIG. 5 is a schematic diagram illustrating a heating system, according to an example herein.

FIG. 5 illustrates a heating system 500 according to an example herein. The heating system 500 may include heating components 502, 504 and 506. The electrical power delivered to the heating system 500 may be controlled using the approaches illustrated in any of FIGS. 3, 4A, and 4B. For example, the power delivered to the heating component 502 may be controlled using IHC approach and the electrical power delivered to the heating components 504 and 506 may be controlled using the PC approach. Heating components 504 and 506 are collectively referred to herein as heating component 503. The total electrical signal current delivered to the system 500, in this example, may be similar to that of FIG. 4A. In another example, the IHC approach may be used to control the power of the heating component 502, and the PC approach may be used to control the power of the heating components 504 and 506. In this example, the total electrical signal current delivered to the system 500 may be similar to that of FIG. 4B.

The heating system 500 may be used in the fusing system of any of an electrophotographic printer, copier, and fax machine. The heat generated by the system 500 may be used to fuse the toner to the printing media, such as paper. The heating component 502 may be a center heater in the fusing system, and the heating components 504 and 506 may be edge heaters. In such a configuration, the fusing system may use the center heater 502 when the printing media is narrower, and the center heater 502 and the edge heaters 504 and 506 when the printing media is wider, for example the portrait and landscape modes of printing on a paper.

The heating components 502, 504, and 506 may be resistive heating elements, halogen light bulbs, or thin film resistance elements on a ceramic substrate. The heating system 500 may also be used in a 3D printing system for melting the substrate media, or in inkjet printers for removing moisture from the printing media.

Figure 6:
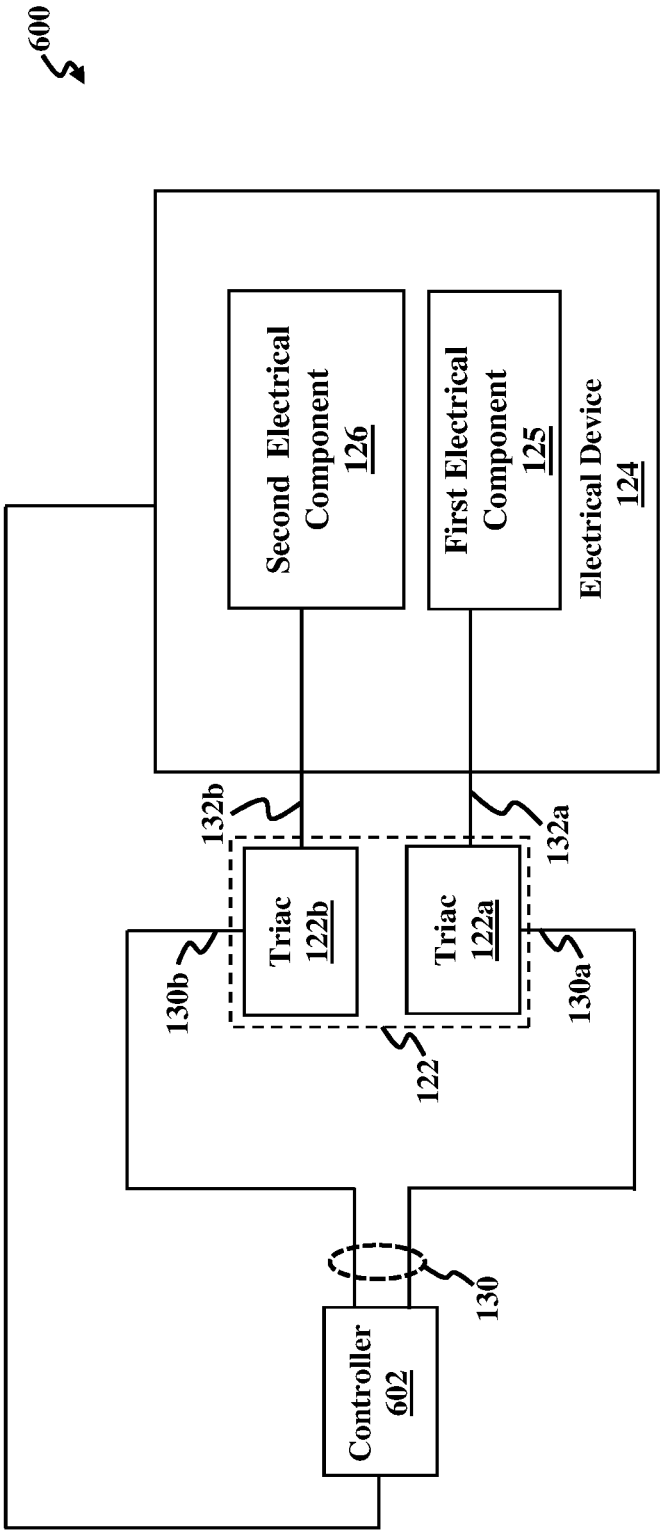
FIG. 6 is a schematic diagram illustrating a system for power control, according to an example herein.

FIG. 6, with reference to FIGS. 1A through 5, illustrates a schematic diagram illustrating a system 600 for power control, according to an example herein. The system 600 comprises a triac device 122 comprising triacs 122a, 122b, and is configured to control, using a trigger signal 130 of the triac device 122, power delivered to an electrical device 124 using a phase control. The phase control comprises changing a cut-off phase of an alternating current electrical signal 132 delivered to the electrical device 124. The triac device 122 increases the power delivered to the electrical device 124 from zero to an operational level $P_o$ using the phase control. A controller 602 is configured to maintain a level of the power delivered to the electrical device at the operational level P, using both the phase control and an integral half cycle control, wherein the integral half cycle comprises selectively removing a plurality of half cycles from the alternating current electrical signal 132 delivered to the electrical device 124.

In one example, the electrical device 124 may further comprise a first electrical component 125 and a second electrical component 126, wherein the triac device comprises a first triac 122a and a second triac 122b electrically coupled to the first and second electrical components 125 and 126 respectively, and wherein the controller 602 may be further configured to use the phase control, via a first trigger signal 130*a* of the first triac 122*a*, to maintain a first power level delivered to the first electrical component 125. The controller 602 also uses the integral half cycle, via a second trigger signal 130*b* of the second triac 122*b*, control to maintain a second power level delivered to the second electrical component 126.

In another example, the controller 602 is further configured to interleave the phase control, via a first trigger signal 130*a* of the first triac 122*a*, and the integral half cycle control on the first electrical component 125 to maintain a first power level delivered to the first electrical component 125. The controller 602 further interleaves the phase control and the integral half cycle control, via a second trigger signal 130*b* of the second triac 122*b*, on the second electrical component 126 to maintain a second power level delivered to the second electrical component 126.

In another example, the controller 602 is further configured to simultaneously use the phase control and the integral half cycle control, via a first trigger signal 130*a* of the first triac 122*a* and a second trigger signal 130*b* of the second triac 122*b*, on the first and second electrical components 125 and 126 respectively, to maintain a first power level delivered to the first electrical component 125 and a second power level delivered to the second electrical component 126.

The system 600 may further comprise a heating device 500 configured to heat a printable media in any of an electro-photographic printer, copier, and fax machine. The heating device 500 may comprise a first heating component 502 and a second heating component 503, and wherein the controller 602 may further be configured to use the first heating component 502 to heat a center region of the printable media, and use the second heating component 503 to heat margin regions of the printable media.

Figure 7:
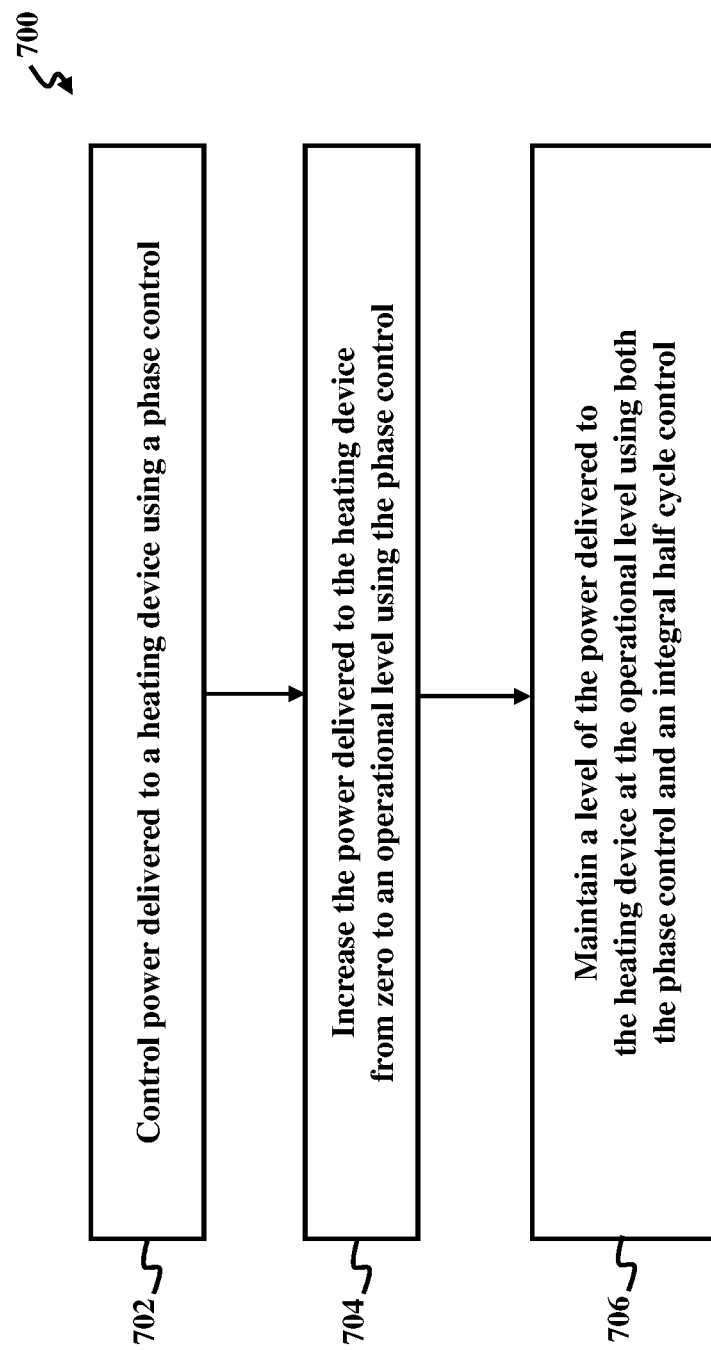
FIG. 7 is a flowchart illustrating a method for controlling electrical power delivered to an electrical device, according to an example herein.

FIG. 7, with reference to FIGS. 1A through 6, is a flow diagram illustrating a method 700, according to an example herein. At block 702, the method 700 controls power delivered to a heating device 500 using a phase control, wherein the phase control comprises changing a cut-off phase of an alternating current electrical signal 132 delivered to the heating device 500. At block 704, the method 700 increases the power delivered to the heating device 500 from zero to an operational level $P_o$ using the phase control. At block 706, the method 700 maintains a level of the power delivered to the heating device 500 at the operational level $P_o$ using both the phase control and an integral half cycle control, wherein the integral half cycle comprises selectively removing a plurality of half cycles from the alternating current electrical signal 132 delivered to the heating device 500.

Examples presented herein may be used to control electrical power delivered to any electrical device, including but not limited to electro-photographic printers, copiers, fax machines, or household or office electrical appliances including iron, refrigerator, oven, rice cooker, television, etc.

Various examples herein can include both hardware and software elements. The examples that are implemented in software include but are not limited to, firmware, resident software, microcode, etc. Other examples may comprise a computer program product configured to include a pre-configured set of instructions, which when performed, can result in actions as stated in conjunction with the methods described above. In an example, the pre-configured set of instructions can be stored on a tangible non-transitory computer readable medium or a program storage device containing software code.

Figure 8:
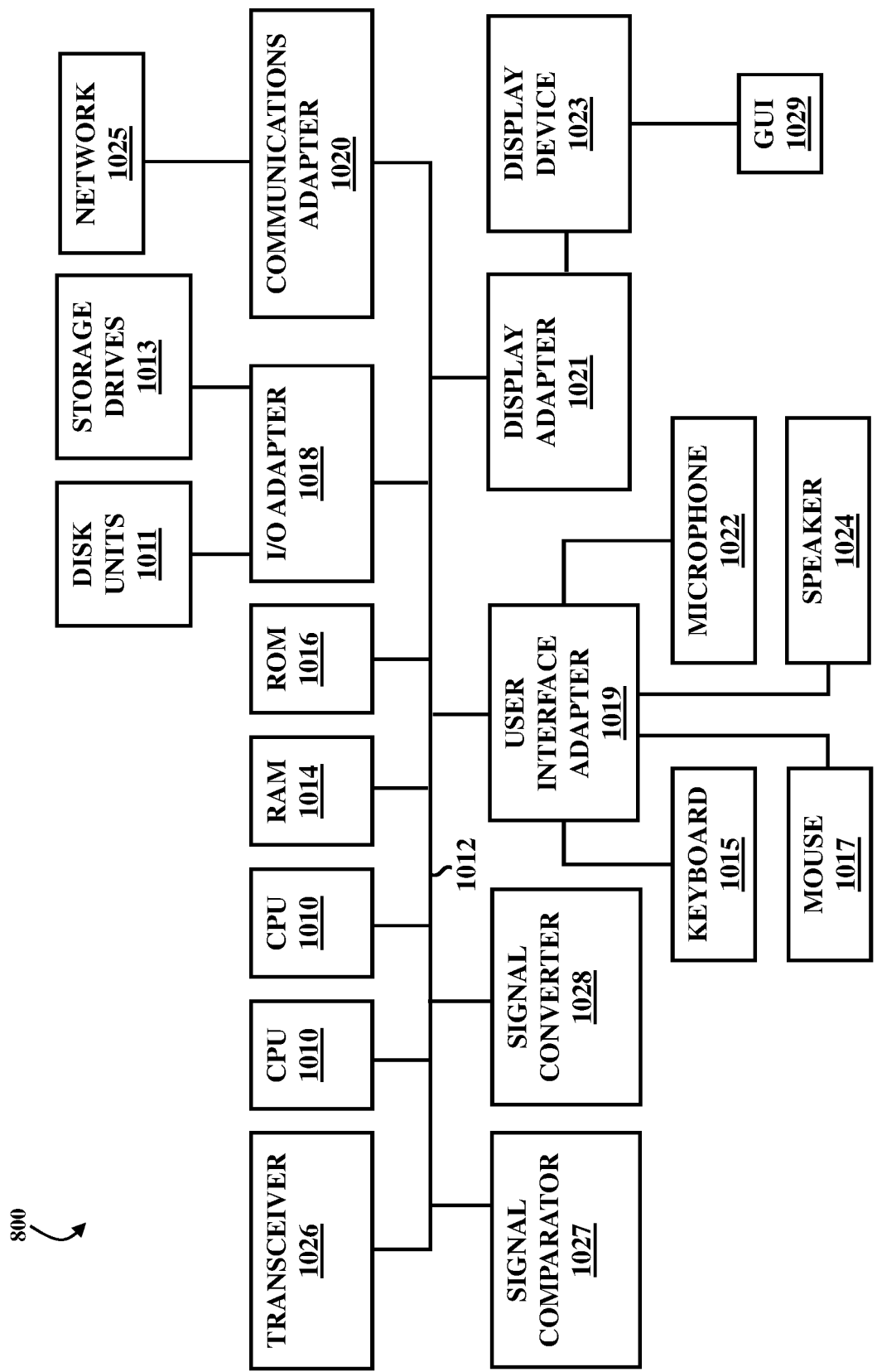
FIG. 8 is a schematic diagram illustrating a computer system according to an example herein.

A representative hardware environment for practicing the examples herein is depicted in FIG. 8. This schematic drawing illustrates a hardware configuration of an information handling/computer system 800 according to an example. The system 800 comprises at least one processor or central processing unit (CPU) 1010. The CPUs 1010 are interconnected via system bus 1012 to various memory devices 1014, 1016 such as a random access memory (RAM) 1014 and a read-only memory (ROM) 1016. The memory devices 1014, 1016 can include local memory employed during actual execution of the program code, bulk storage, and cache memories which provide temporary storage of at least some program code in order to reduce the number of times code must be retrieved from bulk storage during execution. An I/O adapter 1018 can connect to peripheral devices, such as disk units 1011 and storage drives 1013, or other program storage devices that are readable by the system 800. The system 800 further includes a user interface adapter 1019 that may connect to a keyboard 1015, mouse 1017, speaker 1024, microphone 1022, and/or other user interface devices such as a touch screen device (not shown) to the bus 1012 to gather user input. Additionally, a communication adapter 1020 connects the bus 1012 to a data processing network 1025, and a display adapter 1021 connects the bus 1012 to a display device 1023, which provides a graphical user interface (GUI) 1029 for a user to interact with. Further, a transceiver 1026, a signal comparator 1027, and a signal converter 1028 may be connected to the bus 1012 for processing, transmission, receipt, comparison, and conversion of electric or electronic signals, respectively.

The present disclosure has been shown and described with reference to the foregoing exemplary implementations. Although specific examples have been illustrated and described herein it is manifestly intended that the scope of the claimed subject matter be limited only by the following claims and equivalents thereof. It is to be understood, however, that other forms, details, and examples may be made without departing from the spirit and scope of the disclosure that is defined in the following claims.

What is claimed is:

1. A method comprising:
controlling power to an electrical device using a phase control that changes a cutoff phase of an alternating current (AC) electrical signal delivered to the electrical device;
increasing the power delivered to the electrical device to an operational level using the phase control; and
maintaining a level of the power delivered to the electrical device at the operational level using just an integral half cycle control that selectively removes a plurality of half cycles from the AC electrical signal delivered to the electrical device such that a plurality of remaining half cycles in the AC electrical signal delivered to the electrical device have a frequency outside a range of sub-harmonic frequencies,
wherein selectively removing the half cycles from the AC signal delivered to the electrical device using just the integral half cycle control such that the frequency of the remaining half cycles in the AC electrical signal is outside the range of sub-harmonic frequencies reduces perceptible flicker caused by the AC electrical signal.

2. The method of claim 1, wherein the half cycles are removed from the AC electrical signal using just the integral half cycle control such that the remaining half cycles have a frequency less than a lower bound of the range of sub-harmonic frequencies.

3. The method of claim 2, wherein the half cycles have a time period greater than 72 milliseconds,
and wherein for a time cycle of seven of the half cycles, the half cycles are selectively removed from the AC electrical signal such that three half cycles remain in the AC electrical signal.

4. The method of claim 2, wherein the AC electrical signal has a frequency of 50 Hertz, and a time period of the half cycles is half of a time period of the AC electrical signal,
and wherein the half cycles are selectively removed from the AC electrical signal such that three half cycles remain in the AC electrical signal for a time cycle of more than fifty of the half cycles.

5. The method of claim 2, wherein the lower bound of the range of sub-harmonic frequencies is 6 Hertz.

6. The method of claim 1, wherein the half cycles are removed from the AC electrical signal such that the remaining half cycles have a frequency greater than an upper bound of the range of sub-harmonic frequencies.

7. The method of claim 6, wherein the upper bound of the range of sub-harmonic frequencies is 12 Hertz.

8. A non-transitory computer-readable data storage medium storing program code executable by a processor to perform processing comprising:
controlling power delivered to an electrical device using a phase control that changes a cutoff phase of an alternating current (AC) electrical signal;
increasing the power delivered to the electrical device to an operational level using the phase control; and
maintaining a level of the power delivered to the electrical device at the operational level using just an integral half cycle control that selectively removes a plurality of half cycles from the AC electrical signal delivered to the electrical device such that a plurality of remaining half cycles in the AC electrical signal delivered to the electrical device have a frequency outside a range of sub-harmonic frequencies,
wherein selectively removing the half cycles from the AC signal delivered to the electrical device using just the integral half cycle control such that the frequency of the remaining half cycles in the AC electrical signal is outside the range of sub-harmonic frequencies reduces perceptible flicker caused by the AC electrical signal.

9. The non-transitory computer-readable data storage medium of claim 8, wherein the half cycles are removed from the AC electrical signal using just the integral half cycle control such that the remaining half cycles have a frequency less than a lower bound of the range of sub-harmonic frequencies.

10. The non-transitory computer-readable data storage medium of claim 9, wherein the half cycles have a time period greater than 72 milliseconds,
and wherein for a time cycle of seven of the half cycles, the half cycles are selectively removed from the AC electrical signal such that three half cycles remain in the AC electrical signal.

11. The non-transitory computer-readable data storage medium of claim 9, wherein the AC electrical signal has a frequency of 50 Hertz, and a time period of the half cycles is half of a time period of the AC electrical signal,
and wherein the half cycles are selectively removed from the AC electrical signal such that three half cycles remain in the AC electrical signal for a time cycle of more than fifty of the half cycles.

12. The non-transitory computer-readable data storage medium of claim 8, wherein the half cycles are removed from the AC electrical signal such that the remaining half cycles have a frequency greater than an upper bound of the range of sub-harmonic frequencies.

13. The non-transitory computer-readable data storage medium of claim 8, wherein a lower bound of the range of the range of sub-harmonic frequencies is 6 Hertz and an upper bound of the range of sub-harmonic frequencies is 12 Hertz.

14. A system comprising:
a triac device to control delivered to an electrical device using a phase control that changes cutoff phase of an alternating current (AC) electrical signal, and to increase a power delivered to the electrical device to an operational level using the phase control; and
a controller to maintain a level of the power delivered to the electrical device at the operational level using just an integral half cycle control that selectively removes a plurality of half cycles from the AC electrical signal delivered to the electrical device such that a plurality of remaining half cycles in the AC electrical signal delivered to the electrical device have a frequency outside a range of sub-harmonic frequencies,
wherein selectively removing the half cycles from the AC electrical signal delivered to the electrical device using just the integral half cycle control such that the frequency of the remaining half cycles in the AC electrical signal is outside the range of sub-harmonic frequencies reduces perceptible flicker caused by the AC electrical signal.

15. The system of claim 14, wherein the half cycles are removed from the AC electrical signal using just the integral half cycle control such that the remaining half cycles have a frequency less than a lower bound of the range of sub-harmonic frequencies.

16. The system of claim 14, wherein the half cycles are removed from the AC electrical signal such that the remaining half cycles have a frequency greater than an upper bound of the range of sub-harmonic frequencies.

17. The system of claim 14, wherein the range of sub-harmonic frequencies has a lower bound of 6 Hertz and an upper bound of 12 Hertz.

\* \* \* \* \*